Jan. 19, 1960
C. J. MILLER
2,922,035
SATURATING FILTER NETWORK
Filed Nov. 5, 1954
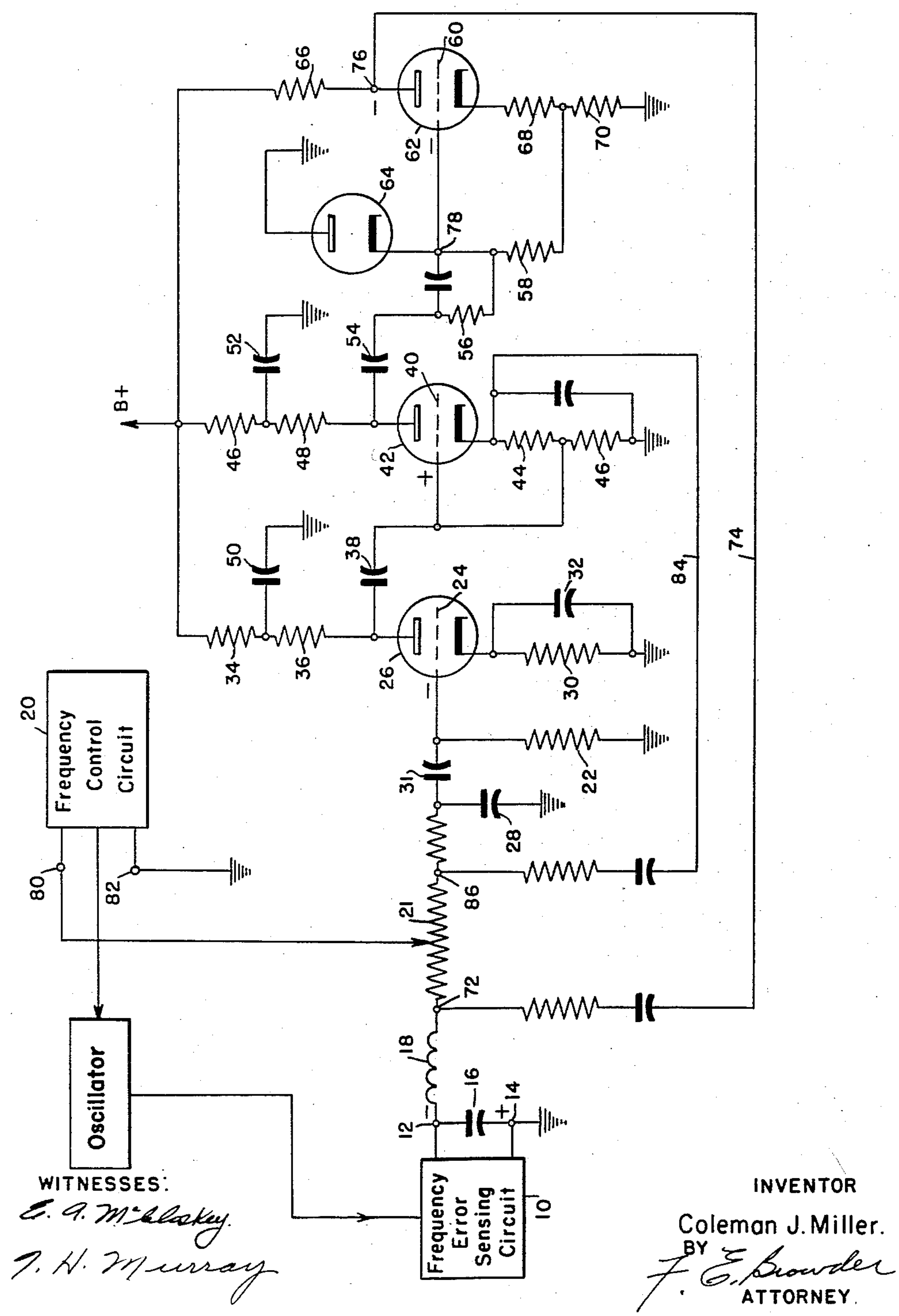
WITNESSES:
E. A. McCloskey
T. H. Murray
INVENTOR
Coleman J. Miller.
BY F. E. Browder
ATTORNEY.

2,922,035
Patented Jan. 19, 1960

2,922,035

SATURATING FILTER NETWORK

Coleman J. Miller, Rock Hill Beach, Md., assignor to Westinghouse Electric Corporation, East Pittsburgh, Pa., a corporation of Pennsylvania Application November 5, 1954, Serial No. 467,101
3 Claims. (Cl. 250—27)

This invention relates to filter networks and, more particularly, to a filter network which is responsive to both the frequency and the amplitude of an applied signal.

In adjustable frequency oscillators, it sometimes becomes desirable or necessary to employ a frequency control system for maintaining the frequency of the oscillator constant at a predetermined set frequency. Such a frequency control system is described in my copending application, Serial No. 408,751, filed February 8, 1954, and assigned to the assignee of the present application. In such a system, a filter is usually required between the error sensing circuit which senses a deviation from a predetermined desired frequency and the frequency control circuit which corrects a deviation from the desired frequency in response to a modulating signal from the error sensing circuit. The filter must have a frequency response allowing it to pass the modulating signal from the error sensing circuit. In addition, it must have a wide frequency response allowing it to pass transient signals such as those caused by mechanical shock. If the filter were not able to pass the transients, the frequency modulating circuit could not compensate for the change in frequency produced by a mechanical shock and, hence, the system will lose control.

Mixed with the modulating signals from the error sensing circuit are spurious (i.e., unwanted) signals. The frequency of these signals is substantially the same as that of the modulating signals from the error sensing circuit, but their amplitude is lower. These spurious signals do not arise as a result of a change in the output frequency of the oscillator of the system. If they are passed on to the frequency control circuit, a deviation from the desired output frequency will result.

Three main types of signals, therefore, appear in the output of the error sensing circuit. They are: one, modulating signals which arise as a result of a frequency shift in the output of the oscillator; two, transient signals which vary over a relatively wide frequency range; and three, spurious signals which have the same frequency as the aforesaid modulating signals but a lower amplitude. A conventional frequency-discriminating filter cannot be designed to pass the modulating and transient signals while blocking the spurious signals.

Accordingly, it is an object of this invention to provide a filter which has a low cutoff frequency under normal conditions to attenuate spurious signals, but which raises its cutoff frequency when necessary to allow passage of a desired signal or a transient.

Another object of the invention lies in the provision of a filter network which is responsive to both the frequency and amplitude of an applied signal.

A still further object of the invention is to employ a degenerative feedback amplifier in a filter network so that the feedback voltage will cancel voltages produced by spurious signals, said amplifier being designed to saturate in response to signals a little larger than the largest spurious signal expected to thereby lose the cancellation effect for the larger signals.

In accordance with the invention, the output of the error sensing circuit of a frequency control system is applied to an error correcting circuit and also to the input terminals of a saturating amplifier. The saturating amplifier is designed to produce a degenerative feedback voltage which opposes the output voltage of the error sensing circuit. The signal which reaches the error correcting circuit is, therefore, equal to the difference between the output voltage of the error sensing circuit and the degenerative feedback voltage produced by the amplifier. By designing the amplifier to saturate in response to signals a little larger than the largest spurious signal expected, the filter will lose its filtering action for the main modulating signals and transients, but will block spurious signals. That is, since the spurious signals are lower in amplitude than the others, they can be effectively cancelled by the feedback voltage of the amplifier. The main modulating signals and transients, however, have an amplitude great enough to overcome the feedback voltage when the amplifier saturates. Therefore, they will pass onto the error correcting circuit to compensate for frequency deviations of the oscillator of the automatic frequency control system.

Other objects and features of the invention will become apparent from the following descriptive matter taken in connection with the accompanying single figure drawing which illustrates the invention schematically.

Referring to the drawing, the output of an oscillator, not shown, is applied to a frequency error sensing circuit 10, disclosed and explained in my copending application, Serial No. 408,751, and filed February 8, 1954. Error sensing circuit 10 includes a discriminator or phase detector having an output error signal appearing at terminals 12 and 14. This signal varies in accordance with deviations in the output frequency of the oscillator from a predetermined set frequency. The error signal is applied through a filter comprising capacitor 16 and inductor 18 to frequency control circuit 20 which shifts the frequency of the oscillator of the system to a desired frequency in response to an error signal from circuit 10. A variable resistor 21 serves to adjust the level of the output signal applied to circuit 20. The filter composed of elements 16 and 18 serves to by-pass high frequency ripple voltages produced by the error sensing circuit and thus prevents them from passing to the saturating amplifier of the system.

Besides the ripple voltages referred to above, the output of error sensing circuit 10 may include: (1) a modulating signal which is produced by circuit 10 in response to a frequency shift of the oscillator of the system; (2) transient signals which may arise from a mechanical shock to the system or from other causes; and (3) spurious signals. The spurious signals have an appreciably lower amplitude than either the modulating or transient signals. This fact is made use of in the present invention in eliminating the spurious signals and preventing them from passing to the frequency control circuit 20.

The input signals applied to terminals 12 and 14 will appear across grid resistor 22 and hence will be impressed on grid 24 of amplifier tube 26. A condenser 28 serves to by-pass ripple voltages which may pass through the filter network 16—18. Element 31 serves as a simple coupling condenser for the input signal. Tube 26 has its cathode connected to ground through cathode resistor 30 and by-pass capacitor 32, and has its plate connected to a source of positive anode voltage, not shown, through plate resistors 34 and 36. The alternating component of the voltage passing through tube 26 is applied through coupling condenser 38 to the grid 40 of a second amplifier tube 42. The plate circuit arrangement of tube 42 is substantially the same as that of tube 26, having its cathode connected to ground through resistors 44 and 46, and its plate connected to the same source of positive voltage as the plate of tube 26 through plate resistors 46 and 48. Capacitors 50 and 52 serve to prevent the alternating currents passing through tubes 26 and 42 from flowing through the common plate voltage source. The output of tube 42 is applied through coupling condenser 54 to grid resistors 56 and 58 and, hence, to the grid 60 of a third amplifier tube 62. A diode clamp 64 is connected to grid 60 for a purpose which will hereinafter be explained. Tube 62 is equipped with suitable cathode and plate resistors 66, 68 and 70 as shown.

Connected between the plate of tube 62 and point 72 is a degenerative feedback path 74. The feedback path 74 supplies a source of voltage to point 72 which opposes the voltage produced by incoming signals. The operation of the circuit in this respect can best be understood by the following analysis of the voltages appearing at various points in the circuit.

Assume, for example, that the instantaneous polarity of the signal applied to input terminals 12 and 14 is as shown in the drawing. A negative voltage is now applied to grid 24 of tube 26. The negative charge on grid 24 induces a positive charge on grid 40 of tube 42 and, therefore, tube 42 conducts heavily to induce a negative charge on grid 60 of tube 62. Current flow through tube 62 is, therefore, decreased and the voltage at point 76 becomes increasingly positive. This voltage is applied through feedback path 74 to point 72, thereby opposing the negative voltage at that point produced by the incoming signal. Amplifier tube 62 is designed to saturate after the amplitude of the incoming signals exceeds a certain predetermined value. Saturation takes place at grid 60 either by drawing grid current when a positive charge is applied to the grid, or by conduction in diode 64 when a negative charge is applied. Diode 64 will conduct when the negative voltage at point 78 exceeds negative ground potential, thereby preventing the negative charge on grid 60 from exceeding a certain maximum value.

As long as the amplitude of the signals applied to terminals 12 and 14 does not exceed the aforesaid predetermined maximum value, the amplifier will operate in the manner described; and variable resistor 21 will be adjusted so that the input voltage will be cancelled by a feedback voltage through path 74. The result of this action is that little, if any, voltage will appear across output terminals 80 and 82. However, after the amplitude of the input signal exceeds the said predetermined value, saturation takes place at grid 60 of tube 62. Therefore, the voltage applied to point 72 through path 74 will not increase above its value established at saturation. At the same time, however, the input voltage can increase in amplitude. The difference between the input voltage and that applied through feedback path 74 will now appear across output terminals 80 and 82. By designing the amplifier so that it will saturate on signals a little larger than the largest spurious signal expected, the filter will block spurious signals but will pass the modulating signals and transients from circuit 10 which have a higher amplitude than the spurious signals. At all times, the amplitude of spurious signals will not be large enough to saturate the amplifier and, therefore, they will not induce a voltage across output terminals 80 and 82.

In order to minimize distortion of modulating signals and transients and to improve the frequency response of the saturating filter, a second degenerative feedback path 84 is provided. Path 84 applies a degenerative feedback voltage to point 86. Since tube 42 is non-saturating, independent control of the modulating and transient signals is provided when tube 62 saturates. It is important to note that since the impedance of diode 64 or grid 60 is extremely low during conduction, the time constant of the grid coupling circuit for tube 62 is small, and, therefore, the time constant of the filter network is low also. This factor enables the frequency control system to achieve extremely rapid recovery from a deviation in frequency from the desired frequency of the system.

It can be seen, therefore, that the present invention provides a filter network which will block signals of a predetermined frequency and amplitude, and which will pass signals of said predetermined frequency but of a greater amplitude than said predetermined amplitude.

Although the invention has been described in connection with a certain specific embodiment, it will be understood by those skilled in the art that various changes in form and arrangement of parts can be made to suit requirements without departing from the spirit and scope of the invention.

I claim as my invention:

1. In a frequency control system, a signal source for producing a signal of a predetermined frequency and initial amplitude, impedance means operatively connected to said source for receiving said signal therefrom, a non-saturating amplifier operatively connected to said impedance means for receiving said signal therefrom, a saturating amplifier operatively connected to the output of a non-saturating amplifier for receiving said signal therefrom, said non-saturating amplifier operating in an unsaturated state when receiving signals having initial amplitudes across said impedance means as large as the initial amplitude of said signal across said impedance means, said saturating amplifier saturating in response to signals having initial amplitudes less than the initial amplitude of said signal, a first degenerative feedback path between said saturating amplifier and said impedance means for cancelling signals thereon which have an initial amplitude less than the initial amplitude of said signal, and a second degenerative feedback path between said non-saturating amplifier and said impedance means.

2. In a frequency control system, a signal source for producing a signal of a predetermined frequency and initial amplitude at the output thereof, impedance means operatively connected to said source for receiving said signal therefrom, a first non-saturating amplifier operatively connected to said impedance means for receiving said signal therefrom, a second non-saturating amplifier operatively connected to said first amplifier for receiving said signal therefrom, a saturating amplifier operatively connected to the output of said second non-saturating amplifier for receiving said signal therefrom, said first and second non-saturating amplifiers operating in an unsaturated state when receiving signals having initial amplitudes greater than the initial amplitude of said signal, said saturating amplifier saturating in response to signals having initial amplitudes less than the initial amplitude of said signal, said saturating amplifier including an electron discharge device having at least a cathode, an anode and a control electrode, a first degenerative feedback path operatively connecting the anode of said saturating amplifier with said impedance means for cancelling signals thereon which have an initial amplitude less than the initial amplitude of said signal, said second non-saturating amplifier having an electron discharge device including at least a cathode, an anode and a control electrode and a second degenerative feedback path operatively connecting the cathode of said second non-saturating amplifier with said impedance means.

3. In a frequency control system, an oscillator, an error sensing circuit for producing an error signal of a predetermined frequency and initial amplitude at the output thereof, impedance means operatively connected to said sensing circuit for receiving said error signal therefrom, a non-saturating amplifier operatively connected to said impedance means for receiving said error signal therefrom, a saturating amplifier operatively connected to the output of said non-saturating amplifier for receiving said error signal therefrom, said non-saturating amplifier operating in an unsaturated state when receiving signals having initial amplitudes as large as the initial amplitude of said error signal, said saturating amplifier saturating in response to signals having initial amplitudes slightly less than the initial amplitude of said error signal, a first degenerative feedback path between said saturating amplifier and said impedance means for cancelling signals thereon which have an initial amplitude less than the initial amplitude of said error signal, a second degenerative feedback path between said non-saturating amplifier and said impedance means for minimizing the effect of transient signals emanating from said sensing circuit and means operatively connecting said impedance means to said oscillator for adjusting said oscillator frequency in response to said error signal.

References Cited in the file of this patent

UNITED STATES PATENTS

| | | |
|---|---|---|
| 1,863,895 | Bishop | June 21, 1932 |
| 1,976,457 | Ohl | Oct. 9, 1934 |
| 2,106,793 | Burton | Feb. 1, 1938 |
| 2,300,875 | Dickinson | Nov. 3, 1942 |
| 2,312,080 | Crosby | Feb. 23, 1943 |
| 2,406,978 | Wendt et al. | Sept. 3, 1946 |
| 2,462,224 | Rheams | Feb. 22, 1949 |
| 2,482,803 | Smith et al. | Sept. 27, 1949 |
| 2,560,709 | Woodward | July 17, 1951 |
| 2,658,958 | Wells | Nov. 10, 1953 |
| 2,693,565 | Edwards | Nov. 2, 1954 |